United States Patent
Iijima et al.

(10) Patent No.: US 8,145,339 B2
(45) Date of Patent: Mar. 27, 2012

(54) SUBSTRATE PROCESSING APPARATUS AND SUBSTRATE TRANSFER METHOD ADOPTED THEREIN

(75) Inventors: Kiyohito Iijima, Yamanashi (JP); Hiroaki Mochizuki, Yamanashi (JP); Masahiro Numakura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 423 days.

(21) Appl. No.: 12/418,869

(22) Filed: Apr. 6, 2009

(65) Prior Publication Data

US 2009/0269171 A1    Oct. 29, 2009

Related U.S. Application Data

(60) Provisional application No. 61/082,066, filed on Jul. 18, 2008.

(30) Foreign Application Priority Data

Apr. 28, 2008    (JP) .................................. 2008-117043

(51) Int. Cl.
G06F 19/00    (2011.01)
(52) U.S. Cl. ......................................... 700/112; 700/121
(58) Field of Classification Search .................. 700/112, 700/121
See application file for complete search history.

(56) References Cited

U.S. PATENT DOCUMENTS

| | | | | |
|---|---|---|---|---|
| 6,772,029 B2 * | 8/2004 | Kobayashi et al. | ............ | 700/100 |
| 7,031,792 B2 * | 4/2006 | Yoshimoto et al. | ............ | 700/121 |
| 7,072,730 B2 * | 7/2006 | Kobayashi et al. | ............ | 700/100 |
| 7,113,838 B2 * | 9/2006 | Funk et al. | .................... | 700/108 |
| 7,123,980 B2 * | 10/2006 | Funk et al. | .................... | 700/121 |
| 7,266,418 B2 * | 9/2007 | Nakayama et al. | ........... | 700/115 |
| 7,729,798 B2 * | 6/2010 | Hayashida et al. | ........... | 700/218 |
| 2002/0173868 A1 * | 11/2002 | Mukuta et al. | ................. | 700/100 |
| 2003/0021671 A1 * | 1/2003 | Edo | ................. | 414/939 |
| 2003/0074098 A1 * | 4/2003 | Cheung et al. | ................. | 700/121 |
| 2004/0001177 A1 * | 1/2004 | Byun et al. | .................... | 349/187 |
| 2004/0249494 A1 * | 12/2004 | Kobayashi et al. | ........... | 700/112 |
| 2005/0122463 A1 * | 6/2005 | Byun et al. | .................... | 349/187 |
| 2005/0187649 A1 * | 8/2005 | Funk et al. | .................... | 700/121 |
| 2006/0161286 A1 * | 7/2006 | Kobayashi et al. | ........... | 700/112 |
| 2006/0195216 A1 * | 8/2006 | Hashinoki et al. | ........... | 700/112 |
| 2006/0224265 A1 * | 10/2006 | Nakayama et al. | ........... | 700/108 |
| 2007/0179658 A1 * | 8/2007 | Hamada | ........................ | 700/121 |
| 2007/0215180 A1 | 9/2007 | Iijima et al. | | |
| 2007/0250202 A1 * | 10/2007 | Kaneko et al. | ................. | 700/121 |
| 2007/0282474 A1 * | 12/2007 | Schmidt | ........................ | 700/99 |

FOREIGN PATENT DOCUMENTS

JP    2007-250791    9/2007

* cited by examiner

Primary Examiner — Albert Decady
Assistant Examiner — Anthony Whittington
(74) Attorney, Agent, or Firm — Oblon, Spivak, McClelland, Maier & Neustadt, L.L.P.

(57) ABSTRACT

As an interrupt start button is depressed while control, under which product wafers Wp and dummy wafers Wd are transferred in an order defined in a normal transfer pattern, is repeatedly executed, a decision is made based upon wafer transfer history as to whether or not the most recent transfer pattern cycle has ended. If the cycle is determined to have ended, the operation immediately proceeds to the subsequent cycle to transfer interrupt wafers Wf and Wd in an order defined in the interrupt transfer pattern achieved by replacing Wp in the normal transfer pattern with Wf, whereas if the cycle is determined to be incomplete, the wafer transfer based upon the normal transfer pattern is carried on until the cycle ends and then the operation proceeds to the next cycle to transfer Wf and Wd in the order defined in the interrupt transfer pattern.

11 Claims, 14 Drawing Sheets

FIG.4

| SETTING SELECTED FOR SPECIFIC NUMBER OF WAFERS OF EACH TYPE ||
|---|---|
| WAFER TYPE | QUANTITY |
| PRODUCT WAFER (Wp) | L |
| DUMMY WAFER (Wd) | m |
| INTERRUPT WAFER (Wf) | n |

FIG.5A

| SETTING SELECTED FOR SPECIFIC NUMBER OF WAFERS OF EACH TYPE ||
|---|---|
| WAFER TYPE | QUANTITY |
| PRODUCT WAFER (Wp) | L |
| DUMMY WAFER (Wd) | m |
| INTERRUPT WAFER (Wf) | n |

FIG.5B

| INTERRUPT TRANSFER PATTERN ||
|---|---|
| TRANSFER ORDER | WAFER TYPE |
| 1 | INTERRUPT WAFER (Wf) |
| 2 | DUMMY WAFER (Wd) |

FIG.6

| WAFER TRANSFER HISTORY | | |
|---|---|---|
| 1 | Wp | OUT |
| 2 | Wd | OUT |
| 3 | Wp | OUT |

FIG.9A

| NORMAL TRANSFER PATTERN ||
|---|---|
| TRANSFER ORDER | WAFER TYPE |
| 1 | PRODUCT WAFER (Wp) |
| 2 | PRODUCT WAFER (Wp) |
| 3 | DUMMY WAFER (Wd) |

FIG.9B

| INTERRUPT TRANSFER PATTER ||
|---|---|
| TRANSFER ORDER | WAFER TYPE |
| 1 | INTERRUPT WAFER (Wf) |
| 2 | INTERRUPT WAFER (Wf) |
| 3 | DUMMY WAFER (Wd) |

FIG.11

| INTERRUPT TRANSFER PATTERN ||
|---|---|
| TRANSFER ORDER | WAFER TYPE |
| 1 | INTERRUPT WAFER (Wf) |
| 2 | PRODUCT WAFER (Wp) |
| 3 | DUMMY WAFER (Wd) |

FIG.13A

| FIRST INTERRUPT TRANSFER PATTERN ||
|---|---|
| TRANSFER ORDER | WAFER TYPE |
| 1 | INTERRUPT WAFER (Wf) |
| 2 | INTERRUPT WAFER (Wf) |
| 3 | DUMMY WAFER (Wd) |

FIG.13B

| SECOND INTERRUPT TRANSFER PATTERN ||
|---|---|
| TRANSFER ORDER | WAFER TYPE |
| 1 | INTERRUPT WAFER (Wf) |
| 2 | PRODUCT WAFER (Wp) |
| 3 | DUMMY WAFER (Wd) |

SUBSTRATE PROCESSING APPARATUS AND SUBSTRATE TRANSFER METHOD ADOPTED THEREIN

CROSS-REFERENCE TO RELATED APPLICATIONS

This document claims priority to Japanese Patent Application Number 2008-117043, filed on Apr. 28, 2008 and U.S. Provisional Application No. 61/082,066, filed on Jul. 18, 2008, the entire content of which are hereby incorporated by reference.

FIELD OF THE INVENTION

The present invention relates to a substrate processing apparatus that transfers substrates such as semiconductor wafers or FPD (flat-panel display) substrates one at a time from a substrate storage container into a processing chamber and executes a specific type of processing on the substrate having been carried into the processing chamber. It also relates to a substrate transfer method adopted in the substrate processing apparatus.

BACKGROUND OF THE INVENTION

In a substrate processing apparatus such as a plasma processing apparatus used to manufacture semiconductor devices, product wafers in a substrate storage container are taken out of the substrate storage container and carried into a processing chamber one at a time. The product wafer placed in the processing chamber then undergoes processing such as etching or film formation with plasma raised from a processing gas supplied into the processing chamber.

In the substrate processing apparatus, it is crucial to eliminate in an optimal manner particles (fine particles of foreign matter) of reaction products formed as the product wafer is processed inside the processing chamber or particulates entering the processing chamber from the outside.

For instance, particles remaining on the substrate stage disposed inside the processing chamber may adhere to the rear surface of the product wafer placed on the stage and this may adversely affect the subsequent processes to a significant extent. In addition, particles remaining inside the processing chamber may settle onto the product wafer and affect the processing of the product wafer, which would compromise the quality of the semiconductor devices formed from the product wafer as final products.

In the related art, a dummy wafer is transferred into the processing chamber after a specific number of product wafers have been processed in the processing chamber so as to clean the interior of the processing chamber with specific timing and thus eliminate the particles inside the processing chamber in an effective manner (see, for instance, Japanese Laid Open Patent Publication No. 2007-250791).

The substrate processing apparatus may be equipped with an interrupt processing function whereby an interrupt wafer, different from product wafers, is processed with priority by cutting into the processing of product wafers. At such a substrate processing apparatus, with a separate substrate storage container holding interrupt wafers disposed therein, an interrupt wafer taken out of the substrate storage container is transferred into the processing chamber and processing on the interrupt wafer starts in response to an interrupt start operation executed with desired timing, even if the processing of the current lot of product wafers is in progress.

However, since the timing with which the interrupt wafer is transferred is not specially regulated in the related art, the interrupt wafer is taken out of the substrate storage container immediately in response to the interrupt start operation. This gives rise to an undesirable situation that may occur in the substrate processing apparatus that executes the cleaning process with specific timing following the processing executed on the specific number of product wafers, as described earlier, in that depending upon the timing of the interrupt start operation, the interrupt wafer may be transferred in succession with respect to a product wafer.

In other words, when a dummy wafer to be used in the cleaning process is to be carried into the processing chamber next, the interrupt wafer transferred immediately after the product wafer cuts into the flow and the manufacturing process is continuously executed (on the product wafer and the interrupt wafer). In this situation, the cleaning process will be executed on the dummy wafer transferred into the processing chamber after the interrupt wafer. As a result, the timing with which the cleaning process is executed inside the processing chamber will be disrupted which, in turn, will destabilize the conditions inside the processing chamber and ultimately cause inconsistency in the results of the manufacturing process executed on the individual wafers.

An object of the present invention, having been completed by addressing the issues discussed above, is to provide a substrate processing apparatus that does not allow the interrupt substrate processing to destabilize conditions inside the processing chamber and a substrate transfer method that may be adopted in the substrate processing apparatus.

SUMMARY OF THE INVENTION

The object described above is achieved in an aspect of the present invention by providing a substrate transfer method adopted in a substrate processing apparatus that transfers substrates, taken out of a substrate storage container one at a time into a processing chamber and repeatedly executes a manufacturing process on the substrates and a cleaning process for cleaning the interior of the processing chamber. The substrate processing apparatus includes an interrupt start button operated to start, with desired timing, interrupt substrate processing on an interrupt substrate similar to the manufacturing process executed on a product substrate, and a storage unit where a normal transfer pattern defining an order in which the product substrates to undergo the manufacturing process and dummy substrates to be used in the cleaning process are to be taken out of substrate storage containers, an interrupt transfer pattern with interrupt substrates replacing a specific number of product substrates in the normal transfer pattern and substrate transfer history with respect to substrates having been taken out of the substrate storage containers are stored. The substrate transfer method comprises a step in which a decision is made as to whether or not the interrupt start button has been depressed, a step in which control that allows individual substrates to be taken out of the substrate storage containers in the order defined in the normal transfer pattern is repeatedly executed until the interrupt start button is depressed, and a step in which once the interrupt start button has been depressed, a decision is made as to whether or not the most recent transfer pattern cycle has ended based upon the transfer history, control that allows individual substrates to be taken out of the substrate storage containers in the order defined in the interrupt transfer pattern is executed immediately upon determining that the cycle has ended or after executing the control that allows individual substrates to be taken out of the substrate storage containers in the order defined in the normal transfer pattern until the cycle ends if the cycle is determined to have not ended, and the control that allows individual substrates to be taken out of the substrate storage containers in the order defined in the normal transfer pattern resumes after a cycle of the interrupt transfer pattern ends.

The object described above is achieved in another aspect of the present invention by providing a substrate processing apparatus that transfers substrates, taken out of a substrate storage containers one at a time into a processing chamber and repeatedly executes a manufacturing process on the substrates and a cleaning process for cleaning the interior of the processing chamber, comprising an interrupt start button operated to start, with desired timing, interrupt substrate processing on an interrupt substrate similar to the manufacturing process executed on product substrates, a storage unit where a normal transfer pattern defining an order in which the product substrates to undergo the manufacturing process and dummy substrates to be used in the cleaning process are to be taken out of substrate storage containers, an interrupt transfer pattern with interrupt substrates replacing a specific number of product substrates in the normal transfer pattern and transfer history with respect to substrates having been taken out of the substrate storage containers are stored, and a control unit that makes a decision as to whether or not the interrupt start button has been depressed, repeatedly executes control that allows individual substrates to be taken out of the substrate storage containers in the order defined in the normal transfer pattern until the interrupt start button is depressed, makes a decision as to whether or not the most recent transfer pattern cycle has ended based upon the transfer history once the interrupt start button is depressed, executes control that allows individual substrates to be taken out of the substrate storage containers in the order defined in the interrupt transfer pattern immediately upon determining that the cycle has ended or after executing control for taking out individual substrates from the substrate storage containers in the order defined in the transfer pattern until the cycle ends if the cycle is determined to have not ended and resumes the control that allows individual substrates to be taken out of the substrate storage container in the order defined in the normal transfer pattern once a cycle of the interrupt transfer pattern ends.

According to the present invention described above, an interrupt substrate is not immediately transferred if the interrupt start button is depressed while the normal transfer pattern cycle is in progress as control for taking out individual substrates from the substrate storage containers in the order defined in the normal transfer pattern is repeatedly executed. Instead, the interrupt substrate is transferred in the order defined in the interrupt transfer pattern after the cycle is completed. In addition, the interrupt transfer pattern is defined by modifying the normal transfer pattern with some product substrates in the normal transfer pattern replaced with interrupt substrates, and once the interrupt transfer pattern cycle ends, the operation reverts to the normal transfer pattern cycle. By regulating the timing with which interrupt substrates are transferred based upon the normal transfer pattern or the interrupt transfer pattern as described above, the cleaning process can be executed with uniform timing regardless of the timing with which the interrupt start button is depressed. Consequently, destabilization of the conditions inside the processing chamber attributable to the interrupt substrate processing can be prevented reliably.

The normal transfer pattern may be determined based upon, for instance, a specific number of product substrates. Such a normal transfer pattern may define an order whereby a single dummy substrate is transferred after a single product substrate or a plurality of product substrates. Based upon this normal transfer pattern, the dummy substrate, transferred when the manufacturing process of the single product substrate or the plurality of product substrates ends, i.e., at the end of the cycle, is used in the cleaning process and the cycle made up of the manufacturing process and the cleaning process is repeated a plurality of times. In addition, since the interrupt transfer pattern according to the present invention includes interrupt substrates replacing product substrates, a dummy substrate is bound to be transferred at the end of the interrupt transfer pattern cycle.

At the substrate processing apparatus that executes the cleaning process by transferring into the processing chamber a single dummy substrate after processing a single product substrate or a plurality of product substrates, a decision as to whether or not the normal transfer pattern cycle or the interrupt transfer pattern cycle has ended may be made by determining based upon the transfer history whether or not the substrate transferred immediately before depression of the interrupt start button is a dummy substrate. Based upon these transfer patterns, it is ensured that a dummy substrate is invariably transferred at the end of each cycle. This means that if the substrate transferred immediately before a depression of the interrupt start button is not a dummy substrate, the particular transfer pattern cycle has not ended and that if the substrate transferred immediately before a depression of the interrupt start button is a dummy substrate, the particular transfer pattern has ended. In this manner, the decision as to whether or not the transfer pattern cycle has ended can be made with ease.

In addition, the interrupt transfer pattern may be determined based upon, for instance, a specific number of interrupt substrates. If the specific number of interrupt substrates is equal to or smaller than the specific number of product substrates mentioned earlier, the transfer pattern achieved by replacing all or some of the product substrates in the normal transfer pattern with interrupt substrates may be designated as the interrupt transfer pattern. If, on the other hand, the specific number of interrupt substrates exceeds the specific number of product substrates, a plurality of transfer patterns achieved by replacing all or some of the product substrates in the normal transfer pattern with interrupt substrates may be designated as the interrupt transfer pattern. By defining the interrupt transfer pattern in correspondence to the number of interrupt substrates as described above, a desired number of interrupt substrates can be transferred for interrupt processing in without disrupting the timing of the cleaning process.

The interrupt substrates may be, for instance, measurement substrates, each used to measure the conditions following the manufacturing process. In such a case, a measurement chamber where each measurement substrate undergoes a specific type of measurement process may be allocated in the substrate processing apparatus and the control unit may transfer an interrupt substrate having undergone the manufacturing process further into the measurement chamber to execute the specific type of measurement process on the interrupt substrate. When the interrupt substrate is used as a measurement substrate in particular, it is desirable to ensure that conditions inside the processing chamber while processing the interrupt substrate are similar to the conditions under which product substrates are processed and it is also desirable to ensure that the processing of the interrupt substrate does not affect the subsequent product substrate processing. For this reason, it is especially advantageous to use the interrupt substrates as measurement substrates in the invention that allows the interrupt substrates to be processed without disrupting the timing of the cleaning process.

The object described above is achieved in another aspect of the present invention by providing a substrate processing apparatus that transfers substrates, taken out of a substrate storage container one at a time, into a plurality of processing chambers and repeatedly executes a manufacturing process on substrates in each processing chamber and a cleaning process for cleaning the interior of the processing chamber, comprising an interrupt start button operated to start, with desired timing, interrupt substrate processing on an interrupt substrate, similar to the manufacturing process executed on product substrates, a storage unit where a normal transfer pattern defining, in correspondence to each processing chamber, an order in which the product substrates to undergo the manufacturing process and dummy substrates to be used in the cleaning process are to be taken out of substrate storage containers, an interrupt transfer pattern set in correspondence to each processing chamber, with interrupt substrates replacing a predetermined number of product substrates in the normal transfer pattern, and transfer history recorded in correspondence to each processing chamber and indicating substrates having been taken out of the substrate storage containers are stored and a control unit that makes a decision as to whether or not the interrupt start button has been depressed, repeatedly executes, in correspondence to each processing chamber, control that allows individual substrates to be taken out of the substrate storage containers in the order defined in the normal transfer pattern until the interrupt start button is depressed, keeps repeatedly executing the control for taking out individual substrates from the substrate storage containers in the order defined in the normal transfer pattern in conjunction with a processing chamber where the interrupt substrate processing is not to be executed but makes a decision in conjunction with a processing chamber where the interrupt substrate processing is to be executed as to whether or not the most recent pattern cycle has ended based upon the transfer history once the interrupt start button is depressed, executes control that allows individual substrates to be taken out of the substrate storage containers in the order defined in the interrupt transfer pattern immediately upon determining that the cycle has ended or after executing control for taking out individual substrates from the substrate storage containers in the order defined in the transfer pattern until the cycle ends if the cycle is determined to have not ended and resumes the control that allows individual substrates to be taken out of the substrate storage container in the order defined in the normal transfer pattern once a cycle of the interrupt transfer pattern ends.

According to the present invention described above, regardless of the timing with which the interrupt start button is depressed while the manufacturing process and the cleaning process are repeatedly executed through similar cycles in the individual processing chambers, the interrupt substrate processing can be executed in the desired processing chamber among the plurality of processing chambers without disrupting the timing with which the cleaning process is executed in the particular processing chamber. Consequently, destabilization of the conditions inside the processing chamber attributable to the interrupt substrate processing can be prevented reliably.

According to the present convention, which enables execution of the interrupt substrate processing without disrupting the timing of the cleaning process by regulating the timing with which the interrupt substrates are transferred, a substrate processing apparatus and a substrate transfer method adopted therein, that reliably prevent destabilization of the conditions inside the processing chamber, are provided.

BRIEF DESCRIPTION OF THE DRAWINGS

FIG. 4 presents a specific example of the data table used in the embodiment to store a specific number of quantities set for the various types of wafers;

FIG. 5A presents a specific example of a normal transfer pattern that may be adopted in the embodiment;

FIG. 5B presents a specific example of an interrupt transfer pattern that may be adopted in the embodiment;

FIG. 6 presents a specific example of wafer transfer history that may be recorded in the embodiment;

FIG. 9A presents another specific example of a normal transfer pattern that may be adopted in the embodiment;

FIG. 9B presents another specific example of an interrupt transfer pattern that may be adopted in the embodiment;

FIG. 11 presents a specific example of an alternative to the interrupt transfer pattern shown in FIG. 9B;

FIG. 13A shows a first interrupt transfer pattern that is a specific example of a further alternative to the interrupt transfer pattern in FIG. 9B;

FIG. 13B shows a second interrupt transfer pattern continuous from that shown in FIG. 13A.

DETAILED DESCRIPTION OF THE PREFERRED EMBODIMENT

Figure 1:
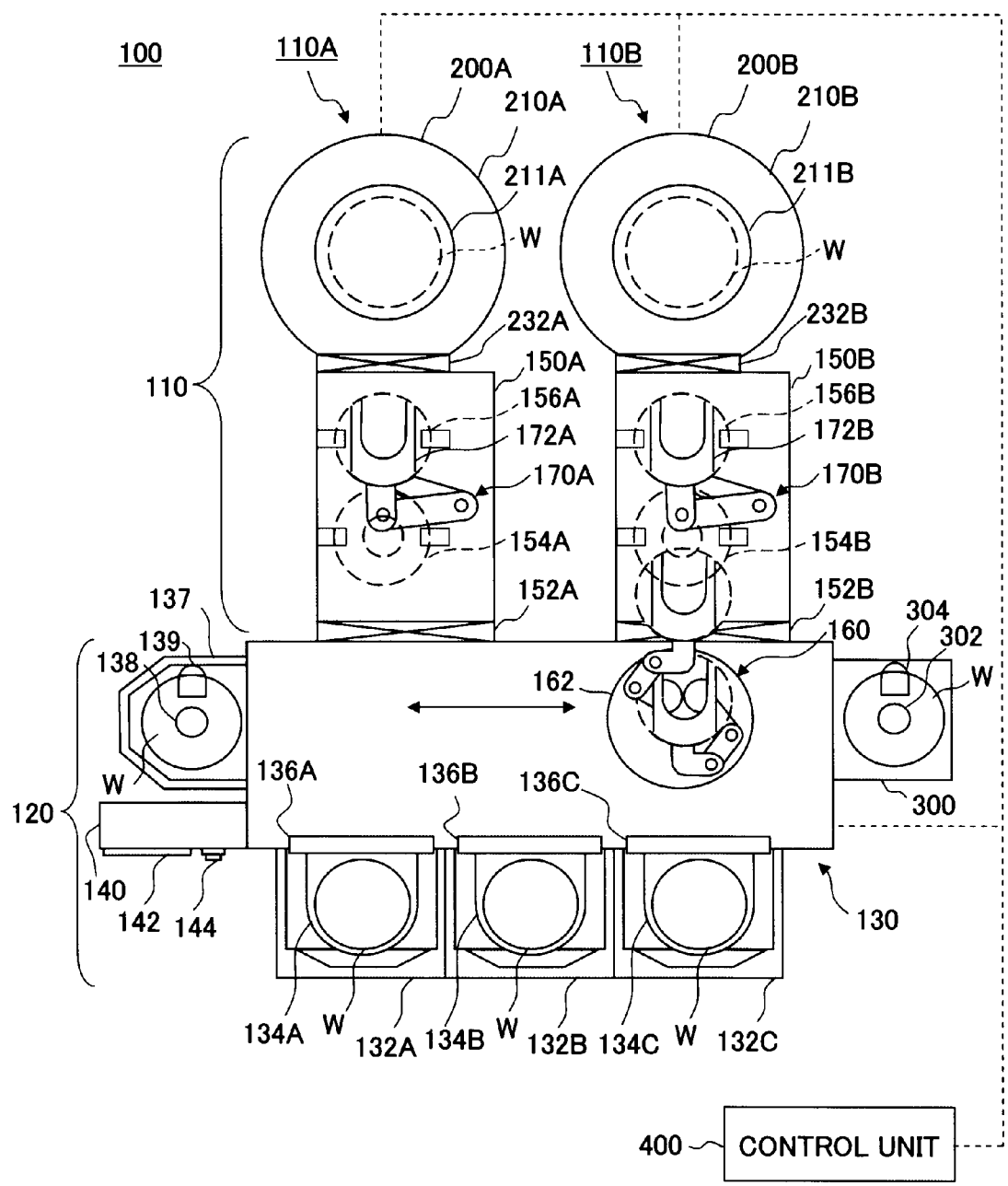
FIG. 1 is a sectional view, presenting a structural example that may be adopted in the substrate processing apparatus according to the present invention.

The following is a detailed explanation of preferred embodiments of the present invention, given in reference to the attached drawings. It is to be noted that in the specification and the drawings, the same reference numerals are assigned to components having substantially identical functions and structural features to preclude the necessity for a repeated explanation thereof.

(Structural Example of Substrate Processing Apparatus)

First, the substrate processing apparatus achieved in an embodiment of the present invention is explained in reference to drawings. The following description is given on an example in which the present invention is adopted in a substrate processing apparatus with at least one vacuum processing unit connected to a transfer chamber. FIG. 1 is a sectional view schematically showing the structure adopted in the substrate processing apparatus in an embodiment of the present invention.

The substrate processing apparatus 100 includes a single vacuum processing unit 110 or a plurality of vacuum processing units 110 where a specific type of processing (e.g., etching) is executed on processing target substrates which may be, for instance, semiconductor wafers (hereafter may be simply referred to as "wafers") W and a transfer unit 120 that transfers the wafers W to/from the vacuum processing units 110. The transfer unit (loader unit) 120 includes a common transfer chamber 130 used when transferring the wafers W.

The example presented in FIG. 1 includes two vacuum processing units (process ships) 110A and 110B disposed along a side surface of the transfer unit 120. The vacuum processing units 110A and 110B respectively include plasma processing devices 200A and 200B and load-lock chambers 150A and 150B disposed continues to the plasma processing devices 200A and 200B and structured as evacuatable relay chambers. At the vacuum processing units 110A and 110B, a single type of processing such as etching is executed on wafers W in the respective plasma processing devices 200A and 200B.

The plasma processing devices 200A and 200B respectively include processing chambers 210A and 210B where a plasma etching process is executed on the surfaces of wafers placed on wafer stages disposed inside the processing chambers, constituted with susceptors (lower electrodes) 211A and 211B by applying radio-frequency power to the susceptors and supplying a processing gas into the processing chambers 210A and 210B.

It is to be noted that while the plasma processing apparatus described above includes two vacuum processing units, as shown in FIG. 1, the present invention is not limited to this example and it may instead be adopted in a substrate processing apparatus that includes three or more vacuum processing units each equipped with a plasma processing device. In addition, it is not essential that each vacuum processing unit include a plasma processing device, and instead, the present invention may be adopted in a substrate processing apparatus that includes a vacuum processing unit equipped with a plasma processing device and a vacuum processing unit equipped with a processing device (e.g., a heat treatment device) other than a plasma processing device.

The transfer chamber 130 at the transfer unit 120 is formed as a box with a substantially rectangular section, in which an inert gas such as $N_2$ gas or clean air is circulated. On one side of the transfer chamber 130 along the longer side of its substantially rectangular section, a plurality of cassette stages 132A through 132C are disposed side-by-side. Cassette containers 134A through 134C can be placed on the cassette stages 132A through 132C respectively. Three load ports 136A through 136C through which wafers W are delivered, respectively corresponding to the cassette stages 132A through 132C, are disposed at the side wall of the transfer chamber 130.

While FIG. 1 shows an example in which a single cassette container, i.e., one of the three cassette containers 134A through 134C is set on each of the cassette stages 132A through 132C, the quantities of cassette stages and cassette containers in the substrate processing apparatus are not limited to those in this example and the quantities of cassette stages and cassette containers in the substrate processing apparatus may instead be, for instance, one or two, or four or more.

The cassette containers 134A through 134C each has a capacity for housing wafers W corresponding to at least one lot (e.g., 25 wafers) stacked with uniform pitches. The cassette containers adopt a sealed structure with their inner spaces filled with, for instance, an $N_2$ gas atmosphere. The wafers W can be transferred between the transfer chamber 130 and the cassette containers 134A and 134B via the load ports 136A through 136C respectively.

In the cassette containers 134A through 134C product wafers Wp to undergo a manufacturing process, dummy wafers Wd used in a cleaning process executed to clean the interior of the processing chambers and interrupt wafers Wf to undergo a manufacturing process similar to that executed on the product wafers Wp are held. In the embodiment, the product wafers Wp are held in the cassette container 134A the dummy wafers Wd are held in the cassette container 134B and the interrupt wafers Wf are held in the cassette container 134C. However, the present invention is not limited to this example and a given cassette container may contain any type of wafer. In addition, the cassette container 134C holding the interrupt wafers Wf may be set in advance on the cassette stage 132C or it may be set on the cassette stage 132C just before processing the interrupt wafers Wf.

A common transfer mechanism (atmospheric pressure-side transfer mechanism) 160 that transfers a wafer W along the length (along the direction indicated by the arrow in FIG. 1) of the transfer chamber is disposed inside the transfer chamber 130. The common transfer mechanism 160 is fixed onto, for instance, a base 162 and the base 162 is allowed to slide on a guide rail (not shown) disposed over the central area of the transfer chamber 130 so as to extend along the length thereof via, for instance, a linear motor drive mechanism. The common transfer mechanism 160 may be a double-arm mechanism equipped with two end effectors, as shown in FIG. 1, or it may be a single-arm mechanism equipped with a single end effector.

At the other side surface of the transfer chamber ranging along the longer side of the substantially rectangular section, the base ends of the two load-lock chambers 150A and 150B are connected via switchable gate valves (atmospheric pressure-side gate valves) 152A and 152B. The front ends of the load-lock chambers 150A and 150B are respectively connected to the processing chambers 210A and 210B via switchable gate valves (vacuum pressure-side gate valves) 232A and 232B.

In the load-lock chambers 150A and 150B, a pair of buffer stages 154A and 156A and a pair of buffer stages 154B and 156B on which wafers W are temporarily held in standby are respectively disposed. In the explanation, the buffer stages 154A and 154B disposed closer to the transfer chamber are referred to as first buffer stages, whereas the buffer stages 156A and 156B disposed further toward the processing chambers are referred to as second buffer stages. Individual transfer mechanisms (vacuum pressure-side transfer mechanisms) 170A and 170B, each constituted with an articulated arm capable of flexing, rotating and moving up/down, are disposed respectively between the buffer stages 154A and 156A and between the buffer stages 154B and 156B.

At the front ends of the individual transfer mechanisms 170A and 170B, end effectors 172A and 172B are respectively disposed, so that wafers W can be transferred between the first and second buffer stages 154A and 156A and between the first and second buffer stages 154B and 156B via the end effectors 172A and 172B respectively. It is to be noted that wafers are carried from the load-lock chambers 150A and 150B to the processing chambers 210A and 210B and vice versa via the respective individual transfer mechanisms 170A and 170B.

At an end of the transfer chamber 130, i.e., at one side surface ranging along the shorter side of the substantially rectangular section, a positioning device constituted with an orienter (a pre-alignment stage) 137 to function as a wafer positioning device is disposed. The orienter 137 includes, for instance, a rotary stage 138 and an optical sensor 139 which optically detects the peripheral edge of a wafer W, both installed as built-in units, and aligns the wafer W by detecting an orientation flat, a notch or the like formed therein.

At the other end of the transfer chamber 130, i.e., at the other side surface of the transfer chamber 130 along the shorter side of the substantially rectangular section, a measurement chamber 300 is installed. In the measurement chamber 300, which may be constituted with, for instance, an optical monitor system equipped with a stage 302 upon which a wafer W delivered into the measurement chamber is placed and an optical sensor 304 oriented toward the wafer W placed on the stage 302, the conditions of the wafer W having undergone the manufacturing process are measured. In more specific terms, manufacturing process results such as the film thickness of the surface layer, the CD (critical dimension) value of a wiring groove or a gate electrode and the like may be measured or the number of particles having settled on the surface of the wafer W may be measured in the measurement chamber.

The substrate processing apparatus 100 includes a control unit 400 that individually controls the operations of various components constituting the vacuum processing units 110A and 110B and the transfer unit 120 and an operation unit disposed at one end of the transfer unit 120.

At the operation unit 140, an operation panel 142 constituted with a touch panel equipped with a display unit such as an LCD (liquid crystal display), an interrupt start button 144 operated to start processing an interrupt wafer Wf and the like are disposed. At the display unit, the operating statuses of the individual components constituting the substrate processing apparatus 100, for instance, are indicated. In addition, the user is able to perform various operations for the substrate processing apparatus 100 via the operation panel 142. It is to be noted that instead of providing the interrupt start button 144 as a separate entity from the operation panel 142, the interrupt start button displayed at the operation panel 142 may be operated through touch panel operation.

The operation unit 140 is connected to the control unit 400. In response to an operation performed via the operation unit 140, the control unit 400 executions a specific program based upon data such as a preset recipe so as to control the various components constituting the vacuum processing units 110A and 110B and the transfer unit 120, e.g., the individual plasma processing devices 200A and 200B, the measurement chamber 300, the orienter 137 and the transfer mechanisms 160 and 170. Under the control executed by the control unit, the wafer transfer, the manufacturing process (an etching process in this example) on wafers, the cleaning process in the processing chambers, the wafer measurement process and the like, to be described in detail later, are executed.

(Structural Example of Plasma Processing Devices)

Figure 2:
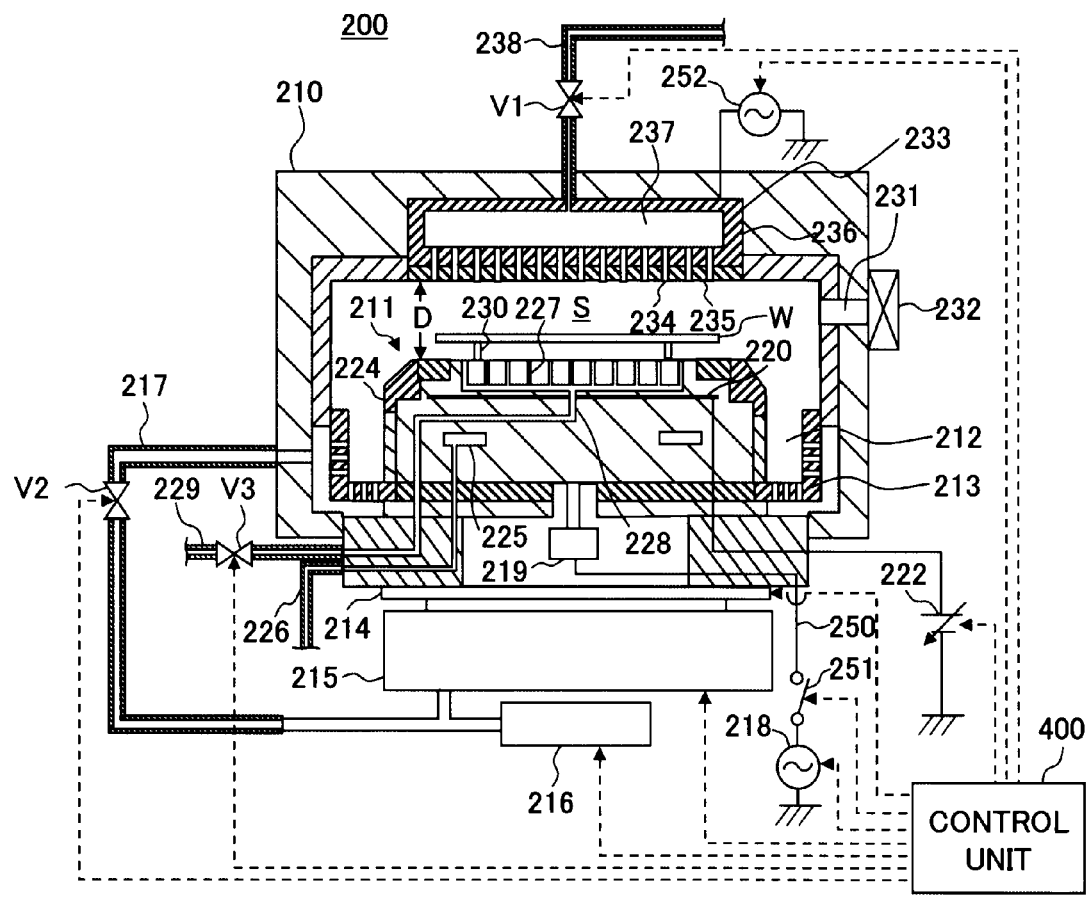
FIG. 2 is a sectional view schematically illustrating the structure of the plasma processing devices shown in FIG. 1.

Next, in reference to a drawing, an example of a structure that may be adopted in the plasma processing devices 200A and 200B is described. It is to be noted that since the plasma processing devices 200A and 200B in the substrate processing apparatus 100 in the embodiment assume identical structures, the following explanation is given on a plasma processing device 200 (with neither letter A nor B attached) representing both plasma processing devices. FIG. 2 is a sectional view schematically showing the structure of the plasma processing device 200. The plasma processing device 200 is a plane-parallel plasma processing device capable of executing an etching process.

As shown in FIG. 2, the plasma processing device 200 includes a cylindrical metal (e.g., aluminum or stainless steel) processing chamber 210, with a susceptor 211 assuming a circular columnar shape to function as a stage upon which a wafer W with a diameter of, for instance, 300 mm, is placed, disposed within the processing chamber 210.

A gas discharge passage 212 through which the gas present above the susceptor 211 is discharged to the outside of the processing chamber 210, is formed between the side wall of the processing chamber 210 and the susceptor 211. A circular baffle plate 213 is disposed in the middle of the gas discharge passage 212 and the space in the gas discharge passage 212 below the baffle plate 213 is connected to an automatic pressure control valve (hereafter referred to as an APC (adaptive pressure control) valve) 214 constituted with a variable butterfly valve. The APC valve 214, which is connected to a turbo-molecular pump (hereafter referred to as a TMP) 215 to function as an exhaust pump engaged in evacuation, is further connected to a dry pump (hereafter referred to as a "DP") 216 to function as an exhaust pump via the TMP 215. Through the exhaust flow path (hereafter referred to as a "main exhaust line") constituted with the APC valve 214, the TMP 215 and the DP 216, the pressure in the processing chamber 210 can be lowered until a state of high-degree vacuum is achieved. The pressure inside the processing chamber 210 is adjusted via the APC valve 214.

The space in the gas discharge passage 212 below the baffle plate 213 is also connected to another exhaust line (hereafter referred to as a "roughing line") which is separate from the main exhaust line. The roughing line is constituted with an exhaust pipe 217 that includes a valve V2 disposed therein and the DP 216. Normally, the gas inside the processing chamber 210 is first discharged through the roughing line before the main exhaust line is engaged.

A predetermined level of radio-frequency power originating from an RF generator 218 is applied to the susceptor 211 functioning as a lower electrode, connected with the RF generator 218 via a lead wire 250. At the lead wire 250, a matcher 218 that maximizes the efficiency with which the radio-frequency power enters the susceptor 211 by reducing the extent of reflection of the radio-frequency power from the susceptor 211 and a switch 251 that switches the lead wire 250 to an ON state or an OFF state are disposed. Via the switch 251 assuming an electrical position between the susceptor 211 and the RF generator 218, the electrical state of the susceptor 211 can be set to either a floating state or a continuous state. For instance, when no wafer W is present on the upper surface of the susceptor 211, the susceptor 211 is set to the electrically floating state via the switch 251.

A disc-shaped electrode plate 220, constituted with a conductive film used to electrostatically hold a wafer W, is disposed at an upper position inside the susceptor 211. A DC power source 222 is electrically connected to the electrode plate 220. The wafer W is pulled toward and held onto the upper surface of the susceptor 211 with coulomb force or Johnsen-Rahbek force generated in correspondence to the DC voltage applied from the DC power source 222 to the electrode plate 220. A ring-shaped focus ring 224, constituted of silicon or the like, causes plasma generated above the susceptor 211 to converge toward the wafer W.

A coolant chamber 225 is formed inside the susceptor 211. A coolant (e.g., cooling water) sustaining a predetermined temperature, supplied from a chiller unit (not shown) via a piping 226, circulates in the coolant chamber 225. The processing temperature of the wafer W set on the susceptor 211 is controlled via the coolant chamber 225.

Over an area of the upper surface of the susceptor 211 to which the wafer W is held (hereafter referred to as a "holding surface"), a plurality of heat transfer gas supply holes 227 and heat transfer gas supply grooves (not shown) are formed. The heat transfer gas supply holes 227 and the heat transfer gas supply grooves are connected to a heat transfer gas supply unit (not shown) via a heat transfer gas supply line 228 installed in and inside the susceptor 211 and a heat transfer gas supply pipe 229 equipped with a valve V3. A heat transfer gas (e.g., He gas) from the heat transfer gas supply unit is supplied to the space between the holding surface and the back surface of the wafer W. Through these measures, the thermal conductivity between the wafer W and the susceptor 211 is improved. It is to be noted that the flow rate of the heat transfer gas supplied to the heat transfer gas supply holes 227 and the heat transfer gas supply grooves is adjusted via the valve V3.

In addition, a plurality of push pins 230 used as lifting pins that can protrude above the upper surface of the susceptor 211 are disposed at the holding surface. As the rotating motion of a motor (not shown) is converted to linear motion via a ball screw or the like, the push pins 230 are caused to move up/down along the vertical direction in the figure. While the wafer W is held onto the holding surface, the push pins 230 are housed inside the susceptor 211 whereas when the wafer W, having undergone the specific processing (e.g., an etching process) is carried out of the processing chamber 210, the push pins project out above the upper surface of the susceptor 211 to lift the wafer W from the susceptor 211.

An upper electrode 233 is disposed at the ceiling of the processing chamber 210. An RF generator 252 is connected to the upper electrode 233 and a specific level of radio-frequency power originating from the RF generator is applied to the upper electrode.

The upper electrode 233 also functions as a showerhead, through which the processing gas is delivered into the processing chamber. The upper electrode 233 is constituted with an electrode plate 235 with numerous gas delivery holes 234 formed therein and an electrode support member 236 that detachably supports the electrode plate 235. A buffer space 237 is formed inside the electrode support member 236 with a processing gas delivery pipe 238, extending from a processing gas supply unit (not shown), connected to the buffer space 237. A valve V1 is disposed in the middle of the processing gas delivery pipe 238 and the flow rate of the gas supplied into the buffer space 237 is adjusted via the valve V1. The distance (electrode distance) D between the susceptor 211 constituting the lower electrode and the upper electrode 233 is set to, for instance, 35±1 mm or more.

At the side wall of the processing chamber 210, a gate valve 232 that opens/closes a transfer port 231 via which the wafer W is carried in/out is disposed. As the processing gas is supplied into the processing chamber 210 and the radio-frequency power is applied to the upper electrode 233 at the plasma processing device 200, high-density plasma is generated in a space S, which, in turn, generates ions and radicals.

(Operations at the Substrate Processing Apparatus)

Next, the operations executed at the substrate processing apparatus 100 structured as described above are described. The substrate processing apparatus is engaged in the following operation when, for instance, a wafer Wp held in the cassette container 134A undergoes the etching process in the processing chamber 210A at the plasma processing device 200A. Namely, the processing target product wafer Wp, taken out of the cassette container 134A via the common transfer mechanism 160, is then carried to the orienter 137 where it is transferred onto the rotary stage 138 for positioning.

The product wafer Wp, having been positioned to the desired orientation, is passed back to the common transfer mechanism 160 and the common transfer mechanism 160 carries the product wafer Wp to a position right in front of the load-lock chamber 150A where the product wafer Wp is to undergo processing. As the gate valve 152A opens, the product wafer Wp held at the common transfer mechanism 160 is carried into the load-lock chamber 150A from the transfer chamber 130. Once the product wafer Wp is fully placed in the load-lock chamber 150, the gate valve 152A closes and pressure adjustment is executed for the product wafer.

As a predetermined degree of vacuum is achieved in the load-lock chamber 150A and the gate valve 232A opens, the product wafer Wp in the load-lock chamber 150A is carried into the processing chamber 210A via the individual transfer mechanism 170A and is placed onto the susceptor 211A. As the delivery of the product wafer Wp into the processing chamber 210A is completed, the gate valve 232A is closed and the etching process on the product wafer Wp starts in the processing chamber 210A.

The etching process is executed based upon a preset process recipe. More specifically, the pressure inside the processing chamber 210 (210A) is lowered and the processing gas (e.g., a mixed gas containing $C_4F_8$ gas, $O_2$ gas and Ar gas) is delivered into the processing chamber 210 at predetermined flow rates and a predetermined flow rate ratio via the upper electrode 233. During this process, the pressure inside the processing chamber 210 is controlled via the APC valve 214 and the like so as to sustain the predetermined degree of vacuum. As the radio-frequency power from the RF generator 218 is applied to the susceptor 211 and the radio-frequency power from the RF generator 252 is applied to the upper electrode 233 in this state, plasma is generated from the processing gas in the plasma generation space S. Radicals and ions formed with the plasma are caused to converge toward the surface of the product wafer Wp by the focus ring 224 and, as a result, the surface of the product wafer Wp becomes physically or chemically etched.

When the etching process executed on the product wafer Wp is completed and the gate valve 232A opens, the product wafer Wp is carried into the load-lock chamber 150A via the individual transfer mechanism 170A. Once the product wafer Wp is carried into the load-lock chamber 150A, the gate valve 232A closes and an operation is executed to carry the product wafer Wp into the transfer chamber 130. Namely, as the gate valve 152A opens, the processed product wafer Wp, having been carried into the load-lock chamber 150A, is transported to the transfer chamber 130 from the load-lock chamber 150A via the common transfer mechanism 160 and the gate valve 152A subsequently closes.

As the etching process is executed on the product wafer Wp, particles of reaction products and the like resulting from the etching process are generated inside the processing chamber 210A. If such particles adhere to the product wafer Wp, problems such as shorting in the wiring in semiconductor devices manufactured from the product wafer Wp are bound to occur, which, in turn, will lead to a reduced yield. Accordingly, a dummy wafer Wd is carried into the processing chamber 210 with predetermined timing and a cleaning process is executed to eliminate the particles present in the processing chamber 210A by using the dummy wafer at the substrate processing apparatus 100.

The cleaning process is executed under preselected cleaning process conditions (e.g., based upon a cleaning recipe indicating a specific processing chamber internal pressure, specific gases, specific gas flow rates and the like). The cleaning process may be executed under conditions similar to those under which the etching process is executed or it may be executed under conditions different from the etching process conditions.

In addition, the timing with which the cleaning process is executed may be determined based upon the number of product wafers Wp to be executed in succession. Furthermore, the cleaning process may be executed continuously over a plurality of sessions and, in such a case, the number of sessions over which the cleaning process is executed continuously may be determined in correspondence to a specific number of dummy wafers Wd. The numbers of product wafers Wp and dummy wafers Wd to be processed continuously may be both set to an initial default value of 1 and the number of wafers of each type to be processed in succession may be subsequently adjusted via the operation panel 142.

In correspondence to the settings selected for the numbers of product wafers and dummy wafers, a wafer transfer pattern with which wafers are taken out of the cassette containers 134A and 134B is determined. For instance, if the setting for the number of dummy wafers Wd is 1 and the setting for the number of product wafers Wp is 2, a transfer pattern whereby a dummy wafer Wd is taken out of the cassette container 134B after two product wafers Wp from the cassette container 134A are transferred in succession constitutes a single cycle. Under control enabling the transfer pattern to be repeated over a plurality of cycles, a specific number of product wafers Wp (e.g., a full lot of product wafers), carried into the processing chamber one at a time, are processed.

The substrate processing apparatus 100 has a function of executing interrupt processing (an express processing function) whereby an interrupt wafer Wf (express wafer) that needs to be processed immediately is allowed to cut in on the normal transfer pattern described above and is processed with priority in addition to the processing function that enables the substrate processing apparatus to process product wafers Wp with the normal transfer pattern. As the interrupt processing function is engaged by, for instance, setting the cassette container 134C holding interrupt wafers Wf on the cassette stage 132C and depressing the interrupt start button 144, an interrupt wafer Wf is transferred into the processing chamber 210A to undergo the etching process with priority even when the processing on the current lot (made up with, for instance, 25 wafers) is in progress.

The transfer pattern cycles may be destabilized if the interrupt wafer Wf is expeditiously transferred from the cassette stage 132C to undergo the etching process through the interrupt processing function described above without regard to the transfer order (the normal transfer pattern) with which product wafers Wp and dummy wafers Wd in the cassette containers 134A and 134B are transferred, as in the related art.

For instance, assuming that the processing is executed over transfer pattern cycles with a single product wafer Wp and a single dummy wafer Wd are alternately taken out of the cassette containers 134A and 134B and transported in each cycle, the cleaning process will be executed each time after a product wafer has been etched, as long as no interrupt occurs to process an interrupt wafer Wf. However, if an interrupt wafer Wf is transferred and processed in the processing chamber immediately following the processing of a product wafer Wp, the cleaning process will be executed after etching a total of two wafers, i.e., the product wafer and the interrupt wafer, in the cycle that includes the processing of the interrupt wafer Wf. The disruption in the transfer pattern cycle is bound to destabilize the timing of the cleaning process, which ultimately will destabilize the conditions inside the processing chamber 210A and may result in inconsistency in the wafer processing results.

Accordingly, destabilization in the conditions inside the processing chamber is prevented with a high level of reliability in the embodiment by ensuring that the interrupt wafer Wf is processed without disrupting the transfer pattern whereby a product wafer Wp and a dummy wafer Wd are transferred in this order. In more specific terms, in response to a depression of the interrupt start button 144, wafer transfer control for controlling the wafer transfer order is executed at the substrate processing apparatus 100 so as to regulate the timing with which the interrupt wafer Wf is taken out of the cassette container 134C. This wafer transfer control is executed by the control unit 400 based upon a specific wafer transfer program.

(Structural Example of the Control Unit)

Figure 3:
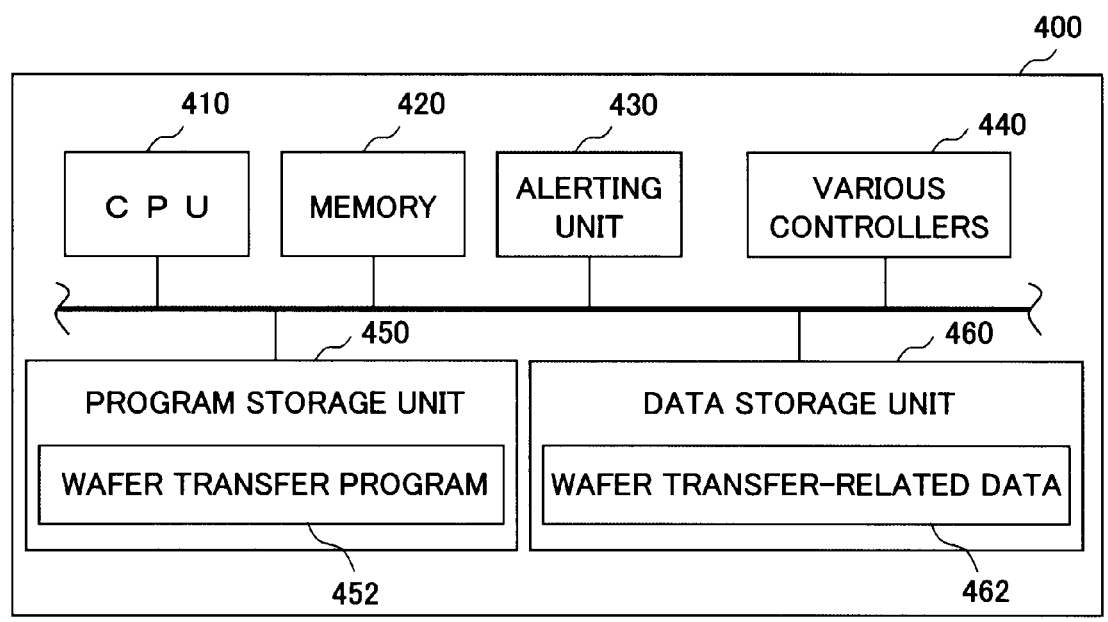
FIG. 3 is a block diagram presenting a structural example that may be adopted in the control unit in FIG. 1.

Next, a structural example that may be adopted in the control unit 400 that executes the wafer transfer control in the embodiment is explained in reference to drawings. As shown in FIG. 3 the control unit 400 comprises a CPU (central processing unit) 410 constituting the control unit main body, a memory 420 such as a ROM (read only memory) or a RAM (random access memory) used by the CPU 410, an alerting unit 430 constituted with, for instance, a warning device such as a buzzer, various controllers 440 engaged in operation by the CPU to control the various units constituting the substrate processing apparatus 100, a program storage unit 450 where programs based upon which the processing is executed in the substrate processing apparatus 100 are stored and a data storage unit 460 where various types of data including recipe data used when executing the processing based upon the programs are stored. The data in the program storage unit 450 and the data storage unit 460, which may be constituted with a recording medium such as a flash memory, a hard disk or a CD-ROM, are read out by the CPU 410 whenever necessary.

The CPU 410, the memory 420, the alerting unit 430, the various controllers 440, the program storage unit 450 and the data storage unit 460 are electrically connected via a bus line such as a control bus, a system bus or a data bus.

The various controllers 440 include controllers that control the individual units constituting the vacuum processing units 110A and 110B and the transfer unit 120, e.g., controllers that control the plasma processing devices 200A and 200B, the measurement chamber 300, the orienter 137 and the transfer mechanisms 160 and 170. The controllers that control the plasma processing devices 200A and 200B further include controllers that control the valves V1, V2 and V3, the APC valve 214, the TMP 215, the DP 216, the RF generators 218 and 252, the DC power source 222 and the switch 251 shown in FIG. 2. The controllers also include a controller that controls data exchange with the operation panel 142 and a controller that detects a depression of the interrupt start button 144.

In addition to a wafer transfer program 152 that enables the wafer transfer control described above, a manufacturing process program based upon which the etching process or the like is executed, a cleaning process program based upon which the interiors of the processing chambers are cleaned, a measurement process program based upon which the wafer processing results are measured and the like (none shown) are stored in the program storage unit 450.

In addition to wafer transfer-related data 462 needed when controlling the individual units under the wafer transfer control, a manufacturing process recipe constituted with setting data (indicating, for instance, a specific processing chamber internal pressure, specific types of gases, specific gas flow rates and specific radio-frequency power) needed when controlling the individual units during the manufacturing process, a cleaning process recipe needed when controlling the individual units during the cleaning process, a measurement process recipe needed when controlling the individual units during the measurement process and the like are stored in the data storage unit 460.

As the wafer transfer-related data 462, a data table indicating specific numbers of product wafers Wp, dummy wafers Wd, and interrupt wafers Wf, such as that shown in FIG. 4, is stored. The specific number of product wafers Wp, indicating the number of product wafers to undergo the manufacturing process in succession, is set in correspondence to the desired timing with which the cleaning process is to be executed. In other words, after the specific number of product wafers Wp have been processed, a dummy wafers Wd is transferred to be used in the cleaning process.

The specific number of dummy wafers Wd indicates the number of dummy wafers to be used in the cleaning process in succession and is set in correspondence to the desired length of time over which the cleaning process is to be executed. In other words, as a greater number of dummy wafers Wd is set in the table, the number of cleaning process sessions executed in succession also increases. The specific number of interrupt wafers Wf may be equal to or smaller than the specific number of other wafers or it may exceed the setting for the specific number of product wafers.

The wafer transfer-related data 462 further include a data table indicating a normal transfer pattern such as that shown in FIG. 5A and an interrupt transfer pattern such as that shown in FIG. 5B. These transfer patterns each indicate a full cycle pattern defining a specific order in which wafers in the individual cassette containers 134A through 134C are to be transferred. The normal transfer pattern in FIG. 5A is determined based upon the specific number of product wafers Wp and the specific numbers of dummy wafers Wd. The normal transfer pattern in the specific example presented in FIG. 5A is defined based upon the specific number of product wafers Wp set to 1 and the specific number of dummy wafers Wd at 1. In this case, a product wafer Wp and a dummy wafer Wd are taken out in this order from the cassette containers 134A and 134B repeatedly over a plurality of cycles.

The interrupt transfer pattern in FIG. 5B is determined based upon a specific numbers of interrupt wafers Wf and dummy wafers Wd. More specifically, the interrupt transfer pattern is achieved by modifying the normal transfer pattern in FIG. 5A with the specific number of interrupt wafers Wf to undergo the interrupt processing replacing the same number of product wafers Wp in the normal transfer pattern. The interrupt transfer pattern in the specific example presented in FIG. 5B is defined based upon the specific number of interrupt wafers Wf set to 1 and the specific number of dummy wafers Wd at 1. In this case, an interrupt wafer Wf and a dummy wafer Wd are taken out in this order from the cassette containers 134C and 134B in a single cycle.

The wafer transfer-related data 462 further include a wafer transfer history data table in which wafer transfer history is updated each time a wafer is taken out of a cassette container. FIG. 6 presents a specific example of such a wafer transfer history data table. The data table in FIG. 6 indicates that the second product wafer Wp has been taken out of the cassette container so far. In other words, the data table indicates that the first product wafer Wp was first taken out of the corresponding cassette container, the first dummy wafer Wd was then taken out of the corresponding cassette container, the second product wafer Wp was taken out but the next wafer has not been taken out of the cassette container. The wafer transfer history is used when making a decision in response to a depression of the interrupt start button as to whether or not the most recent transfer pattern cycle has ended during the wafer transfer control executed by the control unit 400. More specifically, the decision as to whether or not the most recent transfer pattern has ended can be made by comparing the wafer transfer history with the transfer pattern. If the wafer transfer history indicates a status matching the full transfer pattern, the particular transfer pattern cycle can be judged to have ended, whereas if they do not match, it can be judged that the transfer pattern cycle has not ended.

It is to be noted that the decision as to whether or not the most recent transfer pattern cycle has ended may be made in conjunction with a transfer pattern assigning a dummy wafer Wd to be taken out at the end of each cycle, as shown in FIG. 5A, by making a decision based upon the wafer transfer history as to whether or not the wafer taken out immediately before the depression of the interrupt start button 144 is a dummy wafer Wd. Namely, if the wafer taken out immediately before the depression of the interrupt start button 144 is a dummy wafer Wd, the current state can be judged to be a standby state for the next cycle following the end of the preceding transfer pattern cycle. If, on the other hand, the wafer taken out immediately before the depression of the interrupt start button 144 is not a dummy wafer Wd, the particular transfer pattern cycle can be judged to be still underway.

For instance, assuming that information such as that shown in FIG. 6 is provided as the transfer history when the interrupt start button 144 is depressed, the transfer pattern cycle can be judged to be still incomplete since a dummy wafer Wd, to be transferred to complete the cycle following the product wafer Wp having already been transferred immediately before the depression of the interrupt start button 144, has not yet been transferred. Thus, the decision as to whether or not the transfer pattern cycle has ended can be made with ease. It is to be noted that the decision as to whether or not the transfer pattern cycle has ended may be made based upon the wafer transfer history through a method other than that described above.

(Wafer Transfer Control)

Figure 7:
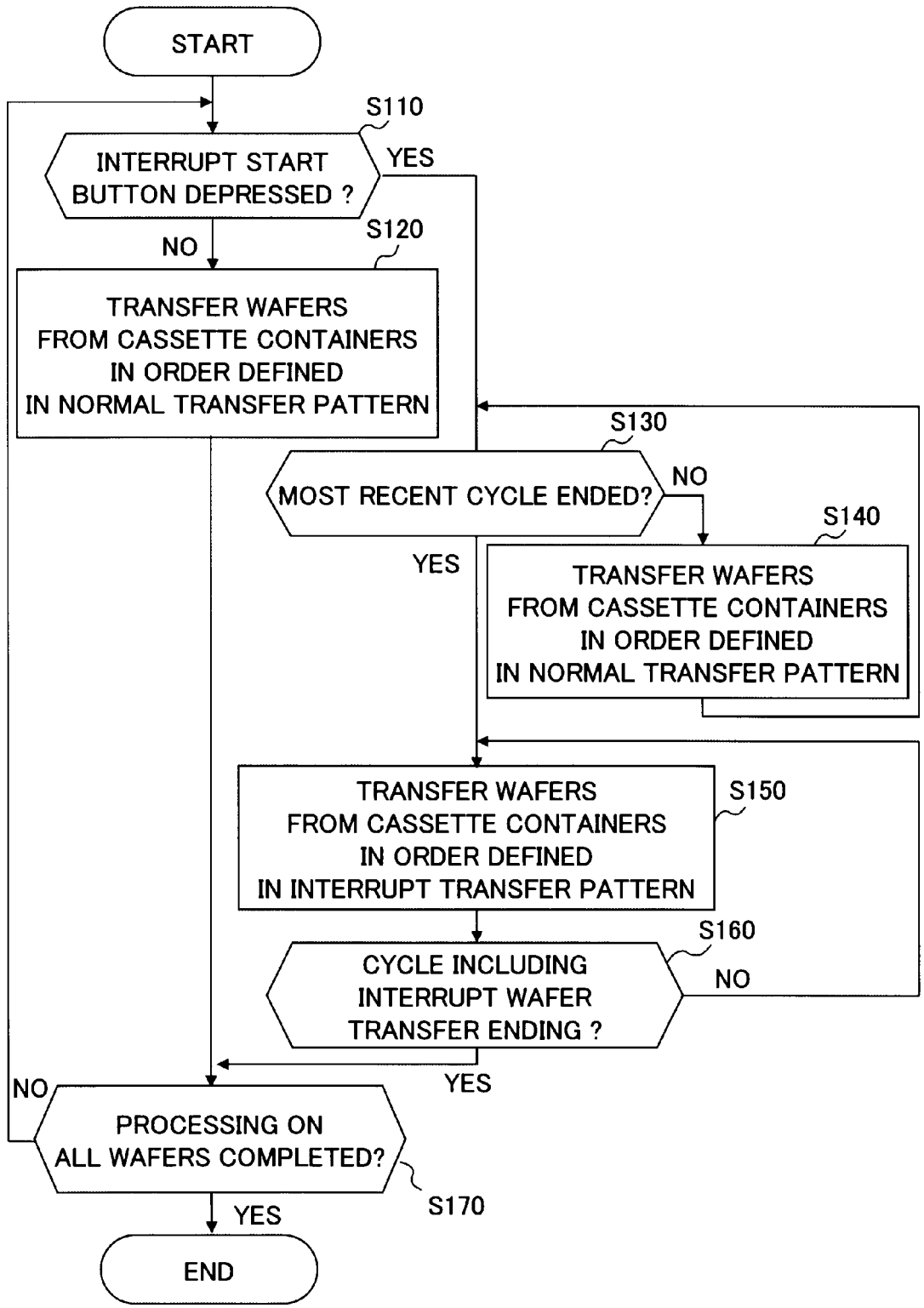
FIG. 7 presents a flowchart of an example of wafer transfer control that may be executed by the control unit in FIG. 1.

Next, an example of wafer transfer control that may be executed by the control unit 400 is described in reference to drawings. FIG. 7 presents a flowchart of the wafer transfer control executed in the embodiment. The following explanation is provided by assuming that the setting for the specific number of product wafers Wp is 1 (L=1 in FIG. 4), that the setting for the specific number of dummy wafers Wd is 1 (m=1 in FIG. 4), that the setting for the specific number of interrupt wafers Wf is 1 (n=1 in FIG. 4) and that the individual wafers are transferred to undergo the processing executed in the processing chamber 210A in the plasma processing device 200A alone. Under such circumstances, the normal transfer pattern shown in FIG. 5A and the interrupt transfer pattern shown in FIG. 5B adopted in conjunction with the processing chamber 210A define the order in which wafers in the individual cassette containers 134A through 134C are transferred.

In the wafer transfer control executed in the embodiment, a decision is first made in step S110 as to whether or not the interrupt start button 144 has been depressed. If it is decided that the interrupt start button 144 has not been depressed, wafers held in the cassette containers 134A and 134B are individually transferred based upon the normal transfer pattern in step S120. The processing in step S120 is repeatedly executed until the interrupt start button 144 is depressed.

Once it is decided in step S110 that the interrupt start button 144 has been depressed, a decision is made in step S130 as to whether or not the normal transfer pattern cycle that was in progress at the time of the depression of the interrupt start button 144 has ended. More specifically, the decision as to whether or not the transfer pattern cycle has ended can be made based upon the wafer transfer history such as that shown in FIG. 6.

If it is decided in step S130 that the normal transfer pattern cycle that was in progress at the time of the depression of the interrupt start button 144 has not ended, wafer transfer processing is executed based upon the order defined in the normal transfer pattern in step S140. For instance, assuming that the wafer transfer history having been recorded at the time of the depression of the interrupt start button 144 is such as that shown in FIG. 6, the wafer transfer in the particular cycle has not ended and, accordingly, wafers are transferred in the order defined in the normal transfer pattern. Namely, a dummy wafer Wd is transferred in step S140.

If it is decided in step S130 that the normal transfer pattern cycle in progress at the time of the depression of the interrupt start button 144 has ended, wafers taken out of the individual cassette containers 134A through 134C in the order defined in the interrupt transfer pattern are transferred into the processing chamber 210A for the next cycle in step S150. If an interrupt transfer pattern achieved by replacing all the product wafers Wp in the normal transfer pattern with interrupt wafers Wf is in effect, the wafers taken out of the cassette containers are interrupt wafers Wf and a dummy wafer Wd. If, on the other hand, an interrupt transfer pattern achieved by replacing some of the product wafers Wp in the normal transfer pattern with interrupt wafers Wf is in effect, the wafers taken out of the cassette containers and transferred into the processing chamber 210A are an interrupt wafer Wf, a product wafers Wp and a dummy wafer Wd.

In the following step S160, a decision is made as to whether or not the cycle that includes the interrupt wafer transfer has ended, and if it is decided that the cycle has not ended, the processing in step S150 is repeatedly executed until the cycle ends. It is to be noted that the decision as to whether or not the cycle that includes the interrupt wafer transfer has ended can be made in step S150 based upon the wafer transfer history, as in step S130.

Once it is decided that the cycle that includes the interrupt wafer transfer has ended, a decision is then made in step S170 as to whether or not all the wafers have been processed. For instance, a decision may be made in step S170 as to whether or not the processing on the entire lot of product wafers Wp (25 wafers) has been completed and the last dummy wafer Wd has been transferred. If it is decided in step S170 that the entire processing has not been completed, the operation returns to step S110 to take individual wafers out of the cassette containers 134A and 134B in the order defined in the normal transfer pattern again. As a result, the processing for the remaining product wafers Wp and dummy wafers Wd is repeatedly executed. Once it is decided in step S170 that all the wafers have been processed, the wafer transfer control sequence ends.

Next, the wafer transfer control is described in more specific terms. When the settings for the specific numbers of product wafers Wp, dummy wafers Wd and interrupt wafers Wf are all 1 (L=1, m=1 and n=1 in FIG. 4), wafers are taken out of the individual cassette containers 134A, 134B and 134C in the order defined in the normal transfer pattern shown in FIG. 5A and the interrupt transfer pattern shown in FIG. 5B.

Under the wafer transfer control executed at these settings, wafers Wp and Wd are transferred in the order indicated in the normal transfer pattern shown in FIG. 5A, until the interrupt start button 144 is depressed. Namely, a cycle such as the first cycle in FIG. 8, in which a dummy wafer Wd taken out of the cassette container 134B is transferred after a product wafer Wp taken out of the cassette container 134A is transferred, is repeated, so as to transfer the product wafer Wp and the dummy wafer Wd in this order to the processing chamber 210 repeatedly. Once the product wafer Wp is delivered into the processing chamber 21A, a specific etching process is executed on the product wafer Wp, whereas once the dummy wafer Wd is delivered into the processing chamber 210A, a cleaning process is executed to clean the interior of the processing chamber 210A.

Assuming that the cassette container 134C holding interrupt wafers Wf is set and the interrupt start button 144 is depressed while, for instance, the second cycle is in progress (e.g., immediately after the product wafer Wp is taken out), the transfer of the wafers Wp and Wd is carried out based upon the normal transfer pattern shown in FIG. 5A until the second cycle ends. In other words, a dummy wafer Wd is transferred to complete the wafer transfer in the second cycle.

Figure 8:
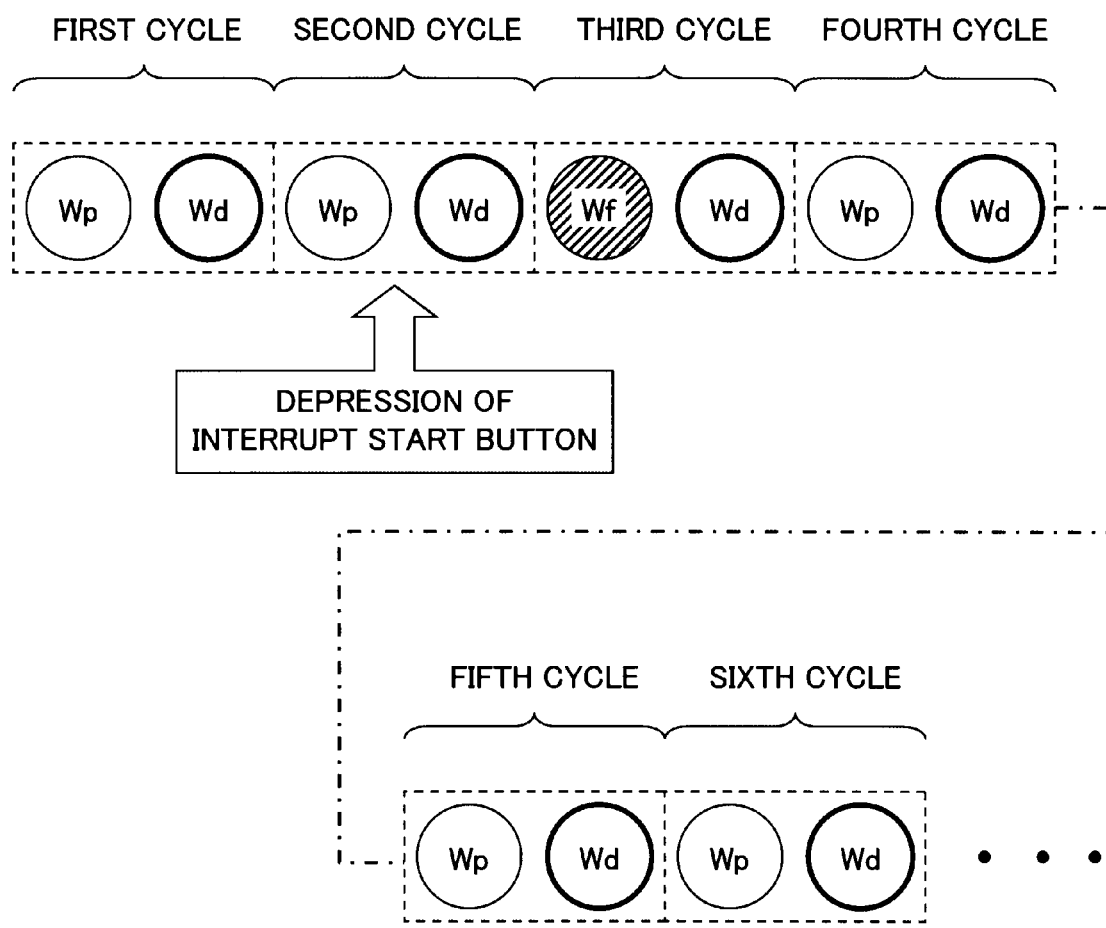
FIG. 8 presents an example of a wafer transfer order that may be defined based upon the transfer patterns shown in FIGS. 5A and 5B.

Then, wafers Wf and Wd are taken out in the order defined in the interrupt transfer pattern shown in FIG. 5B in the following cycle, i.e., the third cycle, as shown in FIG. 8. Namely, a single cycle in which an interrupt wafer Wf is taken out of the cassette container 134C and then a dummy wafer Wd is taken out of the cassette container 134B is executed and the interrupt wafer Wf and the dummy wafer Wd thus taken out are transferred into the processing chamber 210A in this order. Once the interrupt wafer Wf is delivered into the processing chamber 210A, a etching process similar to that executed on product wafers Wp is executed on the interrupt wafer Wf, whereas once the dummy wafer Wd is delivered into the processing chamber 210A, the cleaning process is executed to clean the interior of the processing chamber 210A.

Since an interrupt wafer Wf is never transferred unless the preceding cycle has been completed (unless a dummy wafer Wd has been transferred), the transfer pattern is not disrupted and the timing with which the cleaning process is executed remains constant. In addition, since the interrupt transfer pattern is achieved by modifying the normal transfer pattern with an interrupt wafer Wf replacing the product wafer Wp, wafers Wf and Wd can be transferred based upon the interrupt transfer pattern while the processing of a lot of product wafers is in progress without disrupting the overall transfer pattern for the entire lot or destabilizing the timing of the cleaning process. Consequently, the processing of interrupt wafers Wf does not destabilize the conditions inside the processing chamber 210A and uniform wafer processing results are assured.

Such an interrupt wafer Wf may be a measurement wafer used to measure the conditions of a wafer W having undergone the manufacturing process (e.g., manufacturing process results such as the film thickness of the surface layer and a CD value of a wiring groove, a gate electrode or the like, the number of particles present at the surface of the wafer W and the like). As the interrupt wafer Wf utilized as a measurement wafer is delivered into the processing chamber 210A, a manufacturing process similar to that executed on product wafers Wp is executed. Once the processing in the processing chamber 210A ends, the interrupt wafer is transferred into the measurement chamber 300 to undergo a specific type of measurement process and upon completion of the measurement process, the interrupt wafer is taken back into the cassette container 134C. By adopting the embodiment, it is ensured that the interrupt wafer Wf (the measurement wafer) is allowed to cut into the processing flow without disrupting the transfer pattern. Since the manufacturing process is executed on the interrupt wafer Wf, i.e., the measurement wafer, with the internal conditions in the processing chamber unchanged from those under which product wafers Wp are processed, no discrepancy occurs between the manufacturing process results for the product wafers Wp and the manufacturing process results corresponding to the interrupt wafer Wf. Consequently, processing results similar to those obtained by processing product wafers Wp can be achieved by processing the interrupt wafer Wf, i.e., the measurement wafer, regardless of the timing with which the interrupt start button 144 is depressed. Thus, by using such a measurement wafer for the measurement process, the manufacturing process results can be measured with a high degree of accuracy.

Next, another specific example of wafer transfer control is described. When the settings for the specific number of product wafers Wp, dummy wafers Wd and interrupt wafers Wf are 2, 1 and 2 respectively (L=2, m=1 and n=2 in FIG. 4), wafers taken out of the individual cassette containers 134A, 134B and 134C in the order defined in the normal transfer pattern shown in FIG. 9A and the interrupt transfer pattern shown in FIG. 9B.

Under the wafer transfer control executed at these settings, wafers Wp and Wd are transferred in the order indicated in the normal transfer pattern shown in FIG. 9A, until the interrupt start button 144 is depressed. Namely, a cycle such as the first cycle in FIG. 10, in which a dummy wafer Wd taken out of its container is transferred after two product wafers Wp are taken out and transferred in succession, is repeated, so as to transfer the product wafers Wp and the dummy wafer Wd in this order to the processing chamber 210 repeatedly. Once a product wafer Wp is delivered into the processing chamber 210A, a specific etching process is executed on the product wafer Wp, whereas once a dummy wafer Wd is delivered into the processing chamber 210A, a cleaning process is executed to clean the interior of the processing chamber 210A.

Assuming that the cassette container 134C holding interrupt wafers Wf is set and the interrupt start button 144 is depressed while, for instance, the first cycle is in progress (e.g., immediately after the second product wafer Wp is taken out), the transfer of the wafers Wp and Wd is carried out based upon the normal transfer pattern shown in FIG. 9A until the first cycle ends. Namely, after taking out the two product wafers Wp from the cassette container 134A in succession, a dummy wafer Wd is taken out of the cassette container 134B and the first cycle is thus completed.

Figure 10:
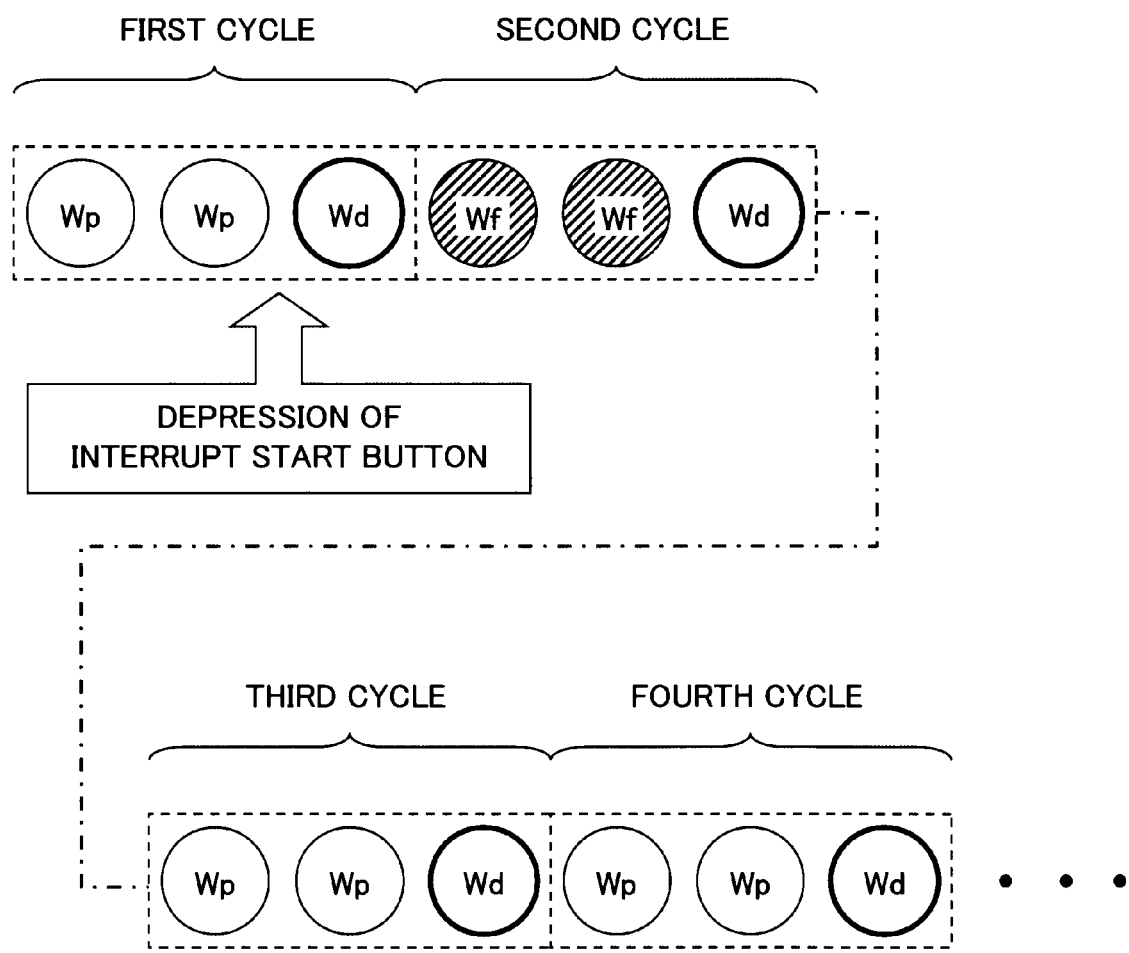
FIG. 10 presents an example of a wafer transfer order that may be defined based upon the transfer patterns shown in FIGS. 9A and 9B.

Then, wafers Wf and Wd are taken out in the order defined in the interrupt transfer pattern shown in FIG. 9B in the following cycle, i.e., the second cycle, as shown in FIG. 10. Namely, a single cycle in which two interrupt wafers Wf are taken out of the cassette container 134C and then a dummy wafer Wd is taken out of the cassette container 134B is executed and the interrupt wafers Wf and the dummy wafer Wd thus taken out are transferred into the processing chamber 210A in this order. Once each interrupt wafer Wf is delivered into the processing chamber 210A, a etching process similar to that executed on product wafers Wp is executed on the interrupt wafer Wf, whereas once the dummy wafer Wd is delivered into the processing chamber 210A, the cleaning process is executed to clean the interior of the processing chamber 210A.

Since an interrupt wafer Wf is never transferred unless the preceding cycle has been completed (unless a dummy wafer Wd has been transferred), the transfer pattern is not disrupted and the timing with which the cleaning process is executed remains constant. In addition, since the interrupt transfer pattern is achieved by modifying the normal transfer pattern in FIG. 9A with the two product wafers Wp in the normal transfer pattern in FIG. 9A replaced with two interrupt wafers Wf, as shown in FIG. 9B, wafers can be transferred based upon the interrupt transfer pattern while the processing of a lot of product wafers is in progress without disrupting the overall transfer pattern or destabilizing the timing of the cleaning process. Consequently, the processing of interrupt wafers Wf does not destabilize the conditions inside the processing chamber 210A and uniform wafer processing results are assured.

It is to be noted that while the setting for the specific number of interrupt wafers Wf matches the setting for the specific number of product wafers Wp to be processed in succession in the specific examples described above, the present invention is not limited to these examples and the setting for the specific number of interrupt wafers Wf may be smaller than or greater than the setting for the specific number of product wafers Wp to be processed in succession.

If the setting for the specific number of interrupt wafers Wf matches the setting for the specific number of product wafers Wp, the interrupt transfer pattern can be created simply by replacing all the product wafers Wp in the normal transfer pattern with interrupt wafers Wf, as explained earlier. However, if the setting for the specific number of interrupt wafers Wf is smaller than the setting for the specific number of product wafers Wp, the interrupt transfer pattern may be created by replacing some of the product wafers Wp in the normal transfer pattern with interrupt wafers Wf.

Figure 12:
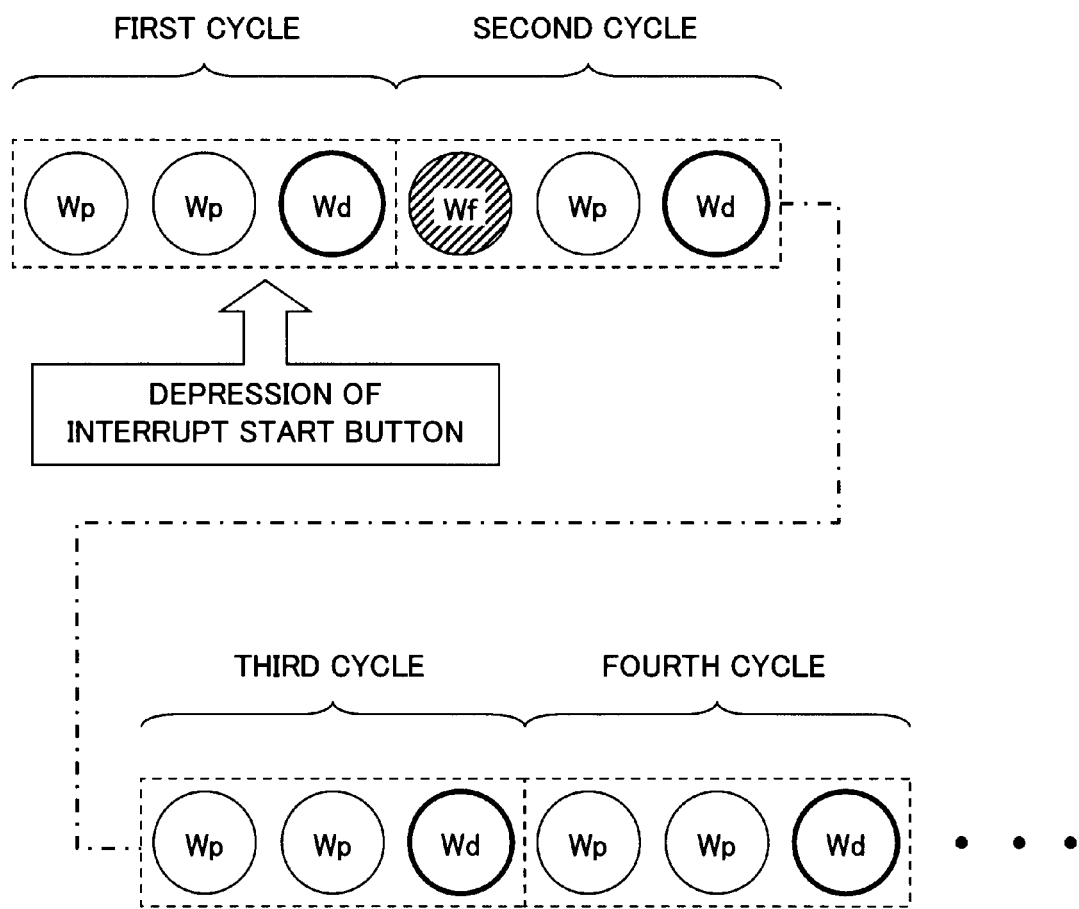
FIG. 12 presents an example of a wafer transfer order that may be defined based upon the transfer patterns shown in FIGS. 9A and 11.

For instance, assuming that each cycle in the normal transfer pattern includes two product wafers Wp and one dummy wafer Wd transferred in this order and that the setting for the specific number of interrupt wafers Wf is 1, the interrupt transfer pattern may be set so that one interrupt wafer Wf, one product wafer Wp and one dummy wafer Wd are transferred in this order, as shown in FIG. 11. Based upon this interrupt transfer pattern, an interrupt wafer Wf, a product wafer Wp and a dummy wafer Wd are transferred in this order in the second cycle after the interrupt start button 144 is depressed during the first cycle, as shown in FIG. 12.

In addition, if the setting for the specific number of interrupt wafers Wf is greater than the setting for the specific number of product wafers Wp, a plurality of interrupt transfer patterns may be set so as to replace in sequence the number of product wafers Wp matching the specific number interrupt wafer Wf. In more specific terms, assuming that each cycle in the normal transfer pattern includes two product wafer Wp and one dummy wafer Wd transferred in this order and the setting for the specific number of interrupt wafers Wd is 3, interrupt wafers Wf may be transferred based upon, for instance, a first interrupt transfer pattern shown in FIG. 13A and a second interrupt transfer pattern shown in FIG. 13B. In the first interrupt transfer pattern, two interrupt wafers Wf and one dummy wafer Wd are transferred in this order, whereas in the second interrupt transfer pattern, one interrupt wafer Wf, one product wafer Wp and one dummy wafer Wd are transferred in this order.

Figure 14:
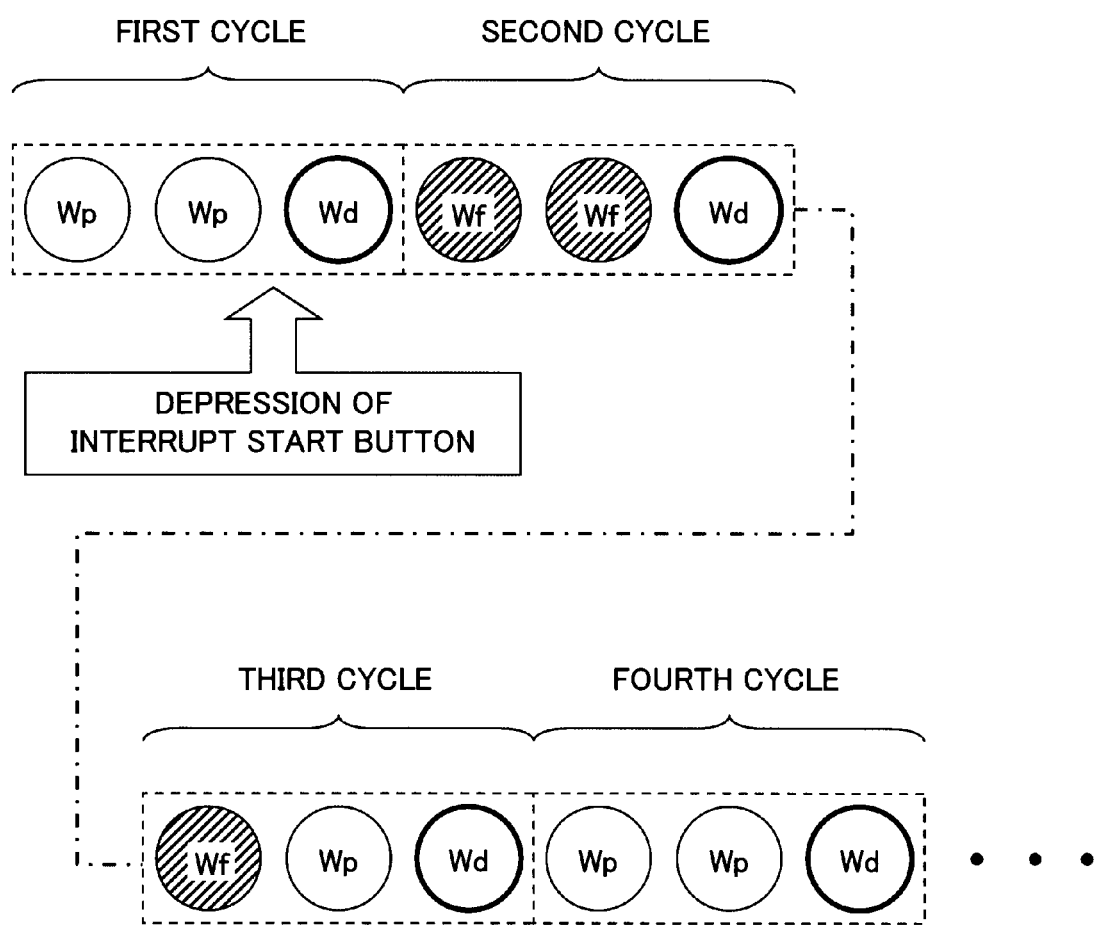
FIG. 14 presents an example of a wafer transfer order that may be defined based upon the transfer patterns shown in FIGS. 9A, 13A and 13B.

In this case, as the interrupt start button 144 is depressed, for instance, halfway through the first cycle, wafers Wf and Wd are taken out based upon the first interrupt transfer pattern in the following second cycle and wafers Wf, Wp and Wd are taken out based upon the second interrupt transfer pattern in the subsequent third cycle, as shown in FIG. 14. Namely, in the second cycle, two interrupt wafers Wf and one dummy wafer Wd are transferred in this order in the second cycle and one interrupt wafer Wf, one product wafer Wp and one dummy wafer Wd are taken out in this order in the third cycle. By setting interrupt transfer patterns in correspondence to the setting for the specific number of interrupt wafers Wf as described above, the desired number of interrupt wafers are allowed to cut into the processing flow without disrupting the timing of the cleaning process.

It is to be noted that while wafers taken out of the cassette containers 134A through 134C are transferred into the processing chamber 210A alone in the examples described in reference to the embodiment, the present invention is not limited to these examples and wafers taken out of the cassette containers 134A through 134C can be transferred to the processing chamber 210B alone under similar wafer transfer control.

In addition, wafers can be transferred to both the processing chamber 210A and the processing chamber 210B under wafer transfer control similar to that described above by storing normal transfer patterns and interrupt transfer patterns in correspondence to the individual processing chambers 210A and 210B and pre-assigning a specific processing chamber to which interrupt wafers Wf are to be transferred to undergo processing therein. Under such wafer transfer control, wafers taken out of the cassette containers 134A through 134C may be individually transferred one at a time in correspondence to each of the processing chambers 210A and 210B based upon the normal transfer pattern (or the interrupt transfer pattern) set for the particular processing chamber 210A or 210B, or the wafers may be transferred in correspondence to the individual transfer patterns independently of one another. Furthermore, the normal transfer patterns (or the interrupt transfer patterns) set in correspondence to the individual processing chambers 210A and 210B may or may not be identical.

Furthermore, when executing the so-called OR transfer, whereby a wafer is transferred to either the processing chamber 210A or the processing chamber 210B where the processing has ended ahead of the other processing chamber, wafer transfer control similar to that described above may be executed by pre-designating the processing chamber to which interrupt wafers Wf are to be transferred.

While an explanation is given above in reference to the embodiment on wafer transfer patterns in which a dummy wafer Wd taken out of the corresponding cassette container is transferred following the transfer of a single product wafer Wp or a plurality of product wafers Wp, the present invention is not limited to this example. For instance, the present invention may be adopted in conjunction with a transfer pattern in which a dummy wafer Wd is first transferred to the processing chamber to regulate the conditions inside the processing chamber and then a single product wafer Wp or a plurality of product wafers Wp are transferred.

It is to be noted that while an explanation is given above in reference to the embodiment on an example in which the present invention is adopted in the substrate processing apparatus 100 equipped with two processing chambers 210A and 210B, the present invention is not limited to this example and it may be adopted in a substrate processing apparatus equipped with a single processing chamber or a substrate processing apparatus 100 equipped with three or more processing chambers.

In addition, the present invention having been described in detail in reference to the embodiment may be adopted in a system constituted with a plurality of devices or in an apparatus constituted with a single device. Furthermore, it is obvious that the present invention may be achieved by providing a system or an apparatus with a medium such as a storage medium having stored therein a software program enabling the functions of the embodiment and by reading out and executing the program stored in the medium at a computer (or a CPU or an MPU) in the system or the apparatus.

In such a case, the program itself read out from the medium such as a storage medium embodies the functions of the embodiment described above and the medium such as a storage medium having the program stored therein embodies the present invention. The medium such as a storage medium through which the program is provided may be, for instance, a floppy disk, a hard disk, an optical disk, a magneto-optical disk, a CD-ROM, a CD-R, a CD-RW, a DVD-ROM, a DVD-RAM, a DVD-RW, a DVD+RW, magnetic tape, a nonvolatile memory card, or a ROM. Such a program may be obtained through a download of the program into the medium via a network.

It is to be noted that the scope of the present invention includes an application in which an OS or the like operating on the computer executes the actual processing in part or in whole in response to the instructions in the program read out by the computer and the functions of the embodiment are achieved through the processing thus executed, as well as an application in which the functions of the embodiment are achieved as the computer executes the program it has read out.

The scope of the present invention further includes an application in which the program read out from the medium such as a storage medium is first written into a memory in a function expansion board loaded in the computer or a function expansion unit connected to the computer, a CPU or the like in the function expansion board or the function expansion unit executes the actual processing in part or in whole in response to the instructions in the program and the functions of the embodiment described above are achieved through the processing.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, while an explanation is given above in reference to the embodiment on an example in which the present invention is adopted in a tandem-type substrate processing apparatus, with a plurality of processing units, each constituted by connecting a load-lock chamber to a processing chamber, connected in parallel to the transfer unit, the present invention is not limited to this example and it may be adopted in a cluster tool-type substrate processing apparatus with a plurality of processing chambers in a processing unit connected around a common transfer chamber. In such a case, if the product wafers Wp, each traveling through a multiple-processing chamber path, are processed in a plurality of processing chambers, the interrupt wafers Wf, too, may undergo similar processing by traveling through a similar path. Through these measures, the interrupt wafers Wf used as measurement wafers are allowed to cut into the processing executed on a lot of product wafers Wp without disrupting the wafer transfer patterns or destabilizing the conditions inside the processing chambers.

What is claimed is:

1. A substrate transfer method adopted in a substrate processing apparatus that transfers substrates, taken out of a substrate storage container one at a time into a processing chamber, repeatedly executes a manufacturing process on the substrates and a cleaning process for cleaning the interior of the processing chamber, and includes an interrupt start button operated to start interrupt substrate processing on one or more interrupt substrates similar to the manufacturing process executed on product substrates, the one or more interrupt substrates being taken from a second substrate storage container, and a storage unit that stores a normal transfer pattern defining an order in which product substrates to undergo the manufacturing process and dummy substrates to be used in the cleaning process are to be taken out of substrate storage containers, an interrupt transfer pattern with one or more interrupt substrates replacing a specific number of product substrates in the normal transfer pattern, and a substrate transfer history with respect to substrates having been taken out of the substrate storage containers, the substrate transfer method comprising:

performing a normal transfer pattern cycle corresponding to the normal transfer pattern by transferring individual substrates out of the substrate storage container in the order defined in the normal transfer pattern;

detecting when the interrupt start button has been depressed; and when the interrupt start button is detected as having been depressed, determining if the transfer pattern cycle has ended based upon the transfer history, and when the transfer pattern cycle is determined to have ended, immediately starting an interrupt transfer pattern cycle corresponding to the interrupt transfer pattern by transferring the one or more interrupt substrates out of the second substrate storage container in the order defined in the interrupt transfer pattern, and when the normal transfer pattern cycle is determined not to have ended, allowing the normal transfer pattern cycle to end and then starting the interrupt transfer pattern cycle, and resuming control that allows individual substrates to be taken out of the substrate storage container in the order defined in the normal transfer pattern after the interrupt transfer pattern cycle ends.

2. The substrate transfer method according to claim 1, wherein:
the normal transfer pattern is determined based upon a specific number of product substrates.

3. The substrate transfer method according to claim 2, wherein:
the normal transfer pattern defines an order whereby one dummy substrate is transferred after a single product substrate or a plurality of product substrates are transferred.

4. The substrate transfer method according to claim 3, wherein:
the decision as to whether or not a cycle of the normal transfer pattern or the interrupt transfer pattern has ended is made by determining based upon the transfer history whether or not a substrate transferred immediately before depression of the interrupt start button is a dummy substrate.

5. The substrate transfer method according to claim 2, wherein:
the interrupt transfer pattern is determined based upon a specific number of interrupt substrates.

6. The substrate transfer method according to claim 5, wherein:
if the specific number of interrupt substrates is equal to or smaller than the specific number of product substrates, a transfer pattern achieved by replacing all or some of the product substrates in the normal transfer pattern with interrupt substrates is designated as the interrupt transfer pattern.

7. The substrate transfer method according to claim 6, wherein:
if the specific number of interrupt substrates exceeds the specific number of product substrates, a plurality of transfer patterns achieved by replacing all or some of the product substrates in the normal transfer pattern with interrupt substrates are designated as the interrupt transfer pattern.

8. The substrate transfer method according to claim 1, wherein:
the interrupt substrates are a measurement substrates each used to measure conditions following the manufacturing process.

9. A substrate processing apparatus that transfers substrates, taken out of a substrate storage container one at a time into a processing chamber and repeatedly executes a manufacturing process on the substrates and a cleaning process for cleaning the interior of the processing chamber, comprising:

an interrupt start button operated to start interrupt substrate processing on one or more interrupt substrates, similar to the manufacturing process executed on product substrates, the one or more interrupt substrates being taken from a second substrate storage container;

a storage unit that stores a normal transfer pattern defining an order in which the product substrates to undergo the manufacturing process and dummy substrates to be used in the cleaning process are to be taken out of substrate storage containers, an interrupt transfer pattern with one or more interrupt substrates replacing a specific number of product substrates in the normal transfer pattern, and a transfer history with respect to substrates having been taken out of the substrate storage containers; and a control unit that executes control over performance of a normal transfer pattern cycle corresponding to the normal transfer pattern by controlling transfer of individual substrates out of the substrate storage container in the order defined in the normal transfer pattern, and detects when the interrupt start button has been depressed, wherein when the control unit detects that the interrupt start button has been depressed, the control unit determines if the transfer pattern cycle has ended based upon the transfer history, and when the transfer pattern cycle is determined to have ended, the control unit executes control to immediately start an interrupt transfer pattern cycle corresponding to the interrupt transfer pattern by controlling transferring the one or more interrupt substrates out of the second substrate storage container in the order defined in the interrupt transfer pattern, and when the normal transfer pattern cycle is determined not to have ended, the control unit executes control that allows the normal transfer pattern cycle to end and then starts the interrupt transfer pattern cycle, and the control unit resumes control that allows individual substrates to be taken out of the substrate storage container in the order defined in the normal transfer pattern once the interrupt transfer pattern cycle ends.

10. The substrate processing apparatus according to claim 9, further comprising:
a measurement chamber where a substrate undergoes a specific type of measurement process, wherein:
the interrupt substrates are measurement substrates each used to measure conditions after the manufacturing process; and
the control unit transfers an interrupt substrate having undergone the manufacturing process further into the measurement chamber and executes the specific type of measurement process on the interrupt substrate.

11. A substrate processing apparatus that transfers substrates, taken out of a substrate storage container one at a time into a plurality of processing chambers and repeatedly executes a manufacturing process on substrates in each processing chamber and a cleaning process for cleaning the interior of each processing chamber, comprising:

an interrupt start button operated to start interrupt substrate processing on one or more interrupt substrates, similar to the manufacturing process executed on product substrates, the one or more interrupt substrates being taken from a second substrate storage container;

a storage unit that stores a normal transfer pattern defining, in correspondence to each processing chamber, an order in which the product substrates to undergo the manufacturing process and dummy substrates to be used in the cleaning process are to be taken out of substrate storage containers, an interrupt transfer pattern set in correspondence to each processing chamber, with one or more interrupt substrates replacing a predetermined number of product substrates in the normal transfer pattern, and a transfer history recorded in correspondence to each processing chamber and indicating substrates having been taken out of the substrate storage containers; and a control unit that executes control for each processing chamber over performance of a normal transfer pattern cycle corresponding to the normal transfer pattern by controlling transfer of individual substrates out of the substrate storage container in the order defined in the normal transfer pattern, and detects when the interrupt start button has been depressed, wherein the control unit repeatedly executes the control for transferring individual substrates from the substrate storage container in the order defined in the normal transfer pattern in conjunction with a processing chamber where the interrupt substrate processing is not to be executed but when the control unit detects that the interrupt start button has been depressed, the control unit determines in conjunction with a processing chamber where the interrupt substrate processing is to be executed if the transfer pattern cycle has ended based upon the transfer history, and when the transfer pattern cycle is determined to have ended, the control unit executes control to immediately start an interrupt transfer pattern cycle corresponding to the interrupt transfer pattern by controlling transferring the one or more interrupt substrates out of the second substrate storage container in the order defined in the interrupt transfer pattern, and when the normal transfer pattern cycle is determined not to have ended, the control unit executes control that allows the normal transfer pattern cycle to end and then starts the interrupt transfer pattern cycle, and the control unit resumes control that allows individual substrates to be taken out of the substrate storage container in the order defined in the normal transfer pattern once the interrupt transfer pattern cycle ends.

* * * * *